(12) United States Patent
Yang et al.

(10) Patent No.: US 12,293,956 B2
(45) Date of Patent: May 6, 2025

(54) BOILING ENHANCEMENT STRUCTURES FOR IMMERSION COOLED ELECTRONIC SYSTEMS

(71) Applicant: Intel Corporation, Santa Clara, CA (US)

(72) Inventors: Jin Yang, Hillsboro, OR (US); Jimmy Chuang, Taipei (TW); Xicai Jing, Shanghai (CN); Yuan-Liang Li, Taipei (TW); Yuyang Xia, Shanghai (CN); David Shia, Portland, OR (US); Mohanraj Prabhugoud, Hillsboro, OR (US); Maria de la Luz Belmont, Zapopan (MX); Oscar Farias Moguel, Morelia (MX); Andres Ramirez Macias, Zapopan (MX); Javier Avalos Garcia, Zapopan (MX); Jessica Gullbrand, Hillsboro, OR (US); Shaorong Zhou, Shanghai (CN); Chia-Pin Chiu, Tempe, AZ (US); Xiaojin Gu, Shanghai Zizhu Science Park (CN)

(73) Assignee: Intel Corporation, Santa Clara, CA (US)

( * ) Notice: Subject to any disclaimer, the term of this patent is extended or adjusted under 35 U.S.C. 154(b) by 724 days.

(21) Appl. No.: 17/356,014

(22) Filed: Jun. 23, 2021

(65) Prior Publication Data

US 2021/0327787 A1 Oct. 21, 2021

Related U.S. Application Data

(60) Provisional application No. 63/059,900, filed on Jul. 31, 2020.

(51) Int. Cl.
*H01L 23/44* (2006.01)
(52) U.S. Cl.
CPC .................................. *H01L 23/44* (2013.01)
(58) Field of Classification Search
CPC .. H05K 7/1432; H05K 7/203; H05K 7/20218; H05K 7/20236; H05K 7/20263;
(Continued)

(56) References Cited

U.S. PATENT DOCUMENTS 5,719,444 A * 2/1998 Tilton ................... H01L 23/473
257/E23.098
6,437,437 B1 * 8/2002 Zuo ....................... H01L 23/427
257/710
(Continued)

FOREIGN PATENT DOCUMENTS

GB 2576032 B 4/2021
GB 2576030 B 12/2021
(Continued)

*Primary Examiner* — Amir A Jalali
(74) *Attorney, Agent, or Firm* — Hanley, Flight & Zimmerman, LLC

(57) ABSTRACT

An apparatus is described. The apparatus includes a packaged semiconductor device. The packaged semiconductor device having an integrated heat spreader, wherein, a boiling enhancement structure exists on the integrated heat spreader without a block mass residing between the boiling enhancement structure and the integrated heat spreader. The boiling enhancement structure has a structured non-planar surface to promote bubble nucleation in an immersion cooling system.

24 Claims, 15 Drawing Sheets

(58) Field of Classification Search
CPC .............. H05K 7/20272; H05K 7/2029; H05K 7/20318; H05K 7/20327; H05K 7/20336; H05K 7/20381; H05K 7/20409; H05K 7/20418; H05K 7/20445; H05K 7/20254; H05K 7/20663; H05K 7/208; H05K 7/20827; H05K 7/20872; H05K 7/20881; H05K 7/20927; H05K 7/2089; H05K 7/209; H05K 7/20909; H05K 7/20936; H05K 1/0203–0204; H01L 23/04; H01L 23/34; H01L 23/3675; H01L 23/3733; H01L 23/40; H01L 23/4006; H01L 23/4031; H01L 23/405; H01L 23/4056; H01L 23/4087; H01L 23/427; H01L 23/44; H01L 23/473; H01L 23/492; F28D 1/02–0206; F28D 1/0226; F28D 2001/0286; F28F 3/06

See application file for complete search history.

(56) References Cited

U.S. PATENT DOCUMENTS

| | | | |
|---|---|---|---|
| 6,611,057 B2* | 8/2003 | Mikubo | H01L 23/36 257/E23.101 |
| 6,863,117 B2* | 3/2005 | Valenzuela | F28D 15/0233 165/104.21 |
| 7,603,775 B2* | 10/2009 | Meng | F28D 15/046 29/890.032 |
| 2002/0100968 A1* | 8/2002 | Zuo | H01L 23/427 257/715 |
| 2008/0166492 A1* | 7/2008 | Lu | H01L 23/473 257/E23.09 |
| 2010/0275971 A1* | 11/2010 | Zingher | H02S 40/22 136/246 |
| 2012/0328789 A1* | 12/2012 | Lu | C25D 5/54 427/404 |
| 2017/0082326 A1* | 3/2017 | Fisher | H01L 23/4735 |
| 2021/0021089 A1 | 1/2021 | Li et al. | |
| 2021/0120670 A1 | 4/2021 | Tan et al. | |
| 2021/0320050 A1 | 10/2021 | Robinson et al. | |
| 2021/0385971 A1* | 12/2021 | Gorius | H05K 7/20281 |
| 2023/0197567 A1* | 6/2023 | Sylvestre | H01L 23/473 257/712 |

FOREIGN PATENT DOCUMENTS

| | | |
|---|---|---|
| GB | 2597525 A | 2/2022 |
| GB | 2601357 A | 6/2022 |

* cited by examiner

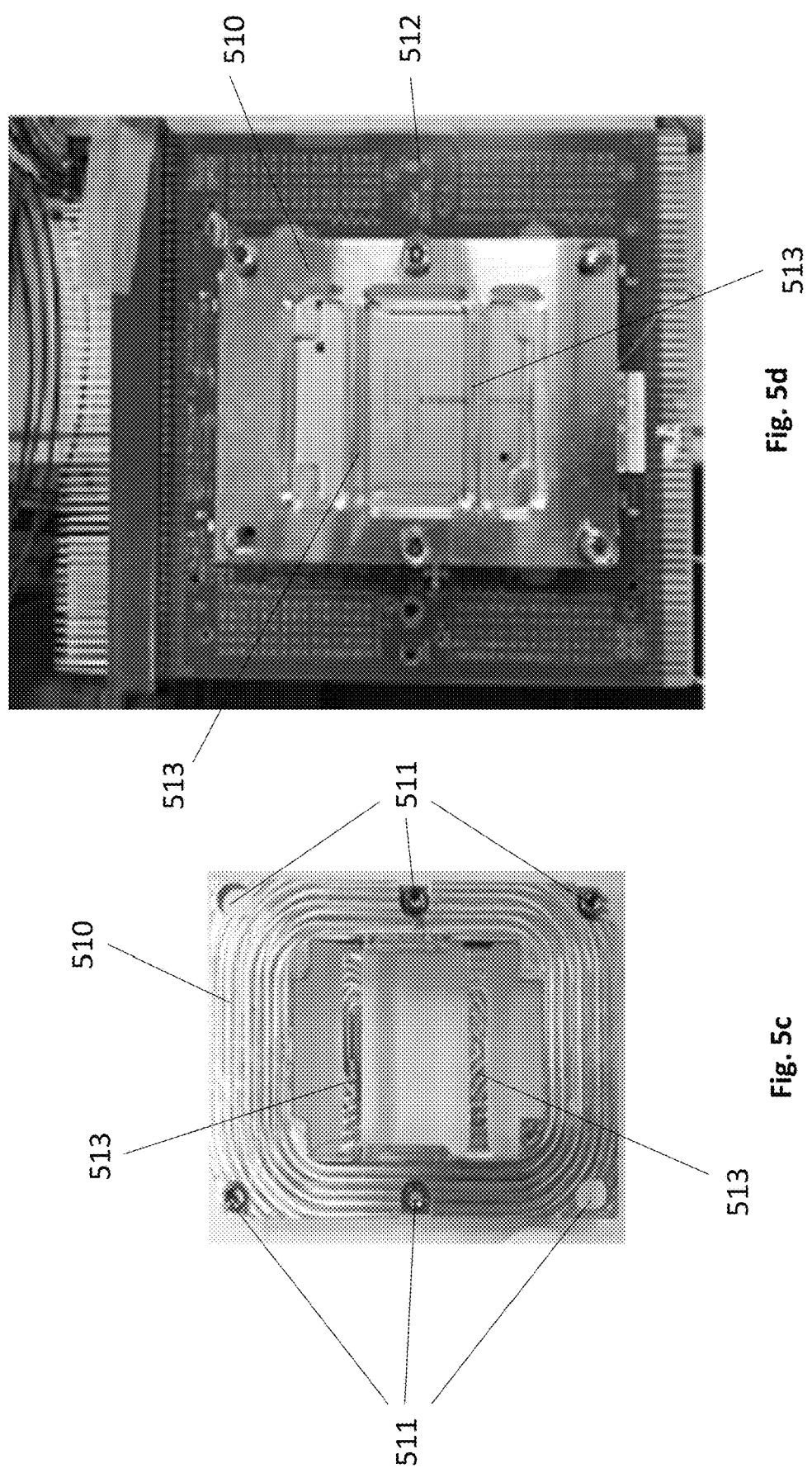

| Description | Case 1<br>Copper Block Attached To IHS With Copper Mesh | Case 2<br>Copper Mesh Attached To IHS |
|---|---|---|
| Power (W) | 205 | 205 |
| Tm (°C) | 56.6 | 56.4 |
| Tcase (°C) | 70.9 | 65 |
| Delta T (°C) | 14.3 | 8.6 |
| Psi_cf (°C/W) | 0.070 | 0.042 |

Fig. 6

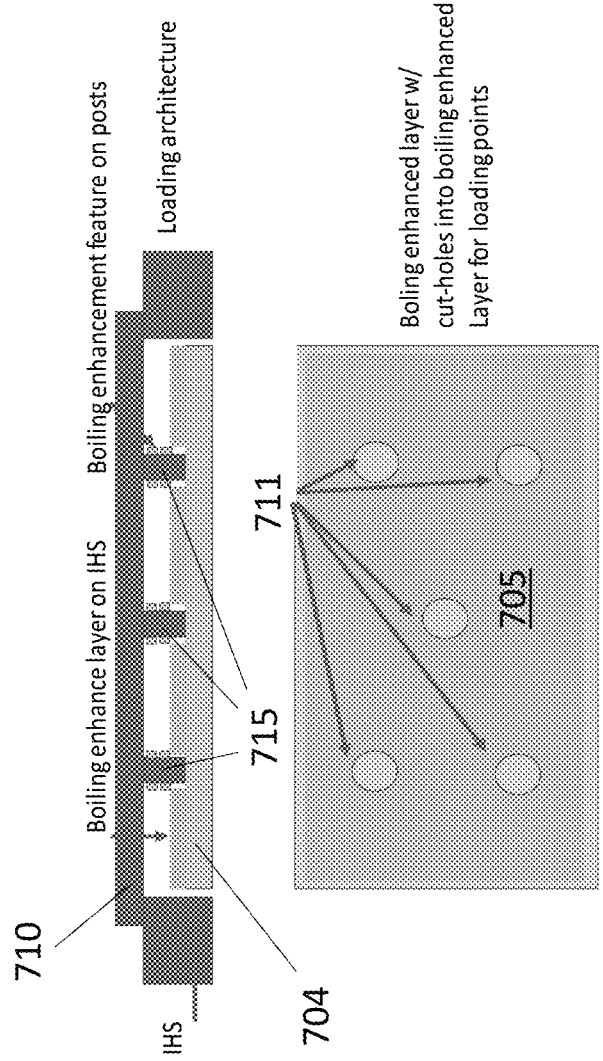
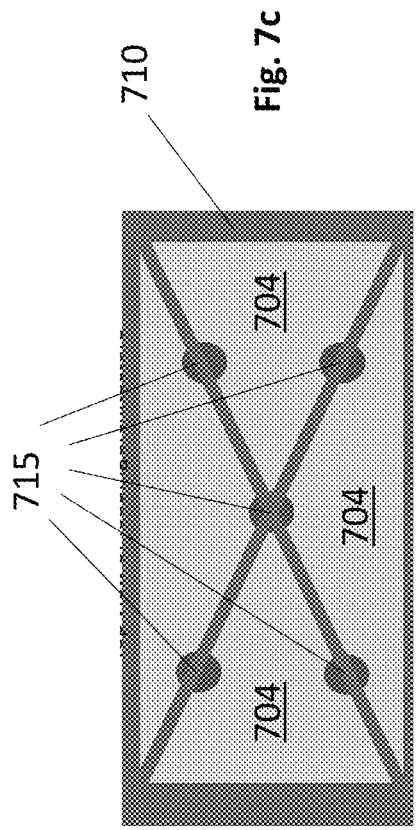
Fig. 7a
Fig. 7b
Fig. 7c

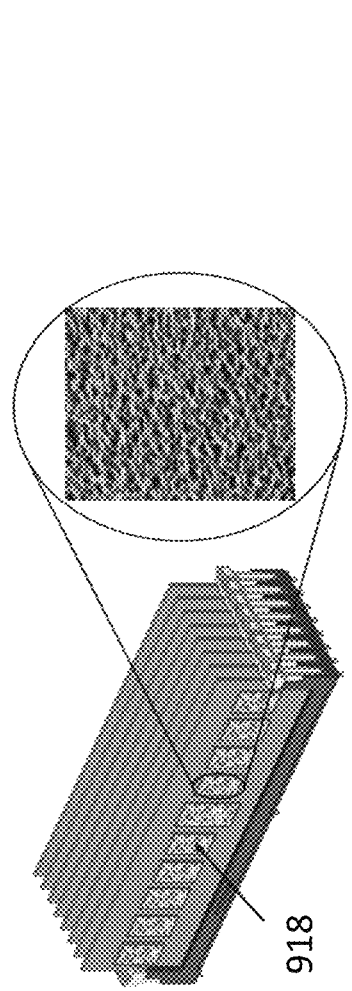
Fig. 9a
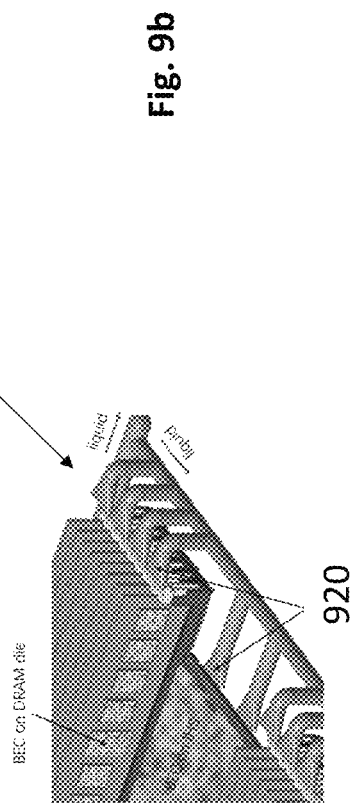
Fig. 9b
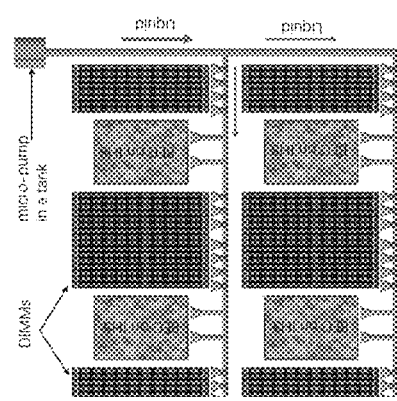

BOILING ENHANCEMENT STRUCTURES FOR IMMERSION COOLED ELECTRONIC SYSTEMS

RELATED CASES

This application claims the benefit of U.S. Provisional Application No. 63/059,900, entitled, "BOILING ENHANCED LAYER ON SEMICONDUCTOR CHIP PACKAGE LID FOR IMMERSION COOLED ELECTRONIC SYSTEMS", filed Jul. 31, 2020, which is incorporated by reference in its entirety.

FIELD OF INVENTION

The field of invention pertains generally to the mechanical arts, and, more specifically, to boiling enhancement structures for immersion cooled electronic systems.

BACKGROUND

System design engineers face challenges, especially with respect to high performance data center computing, as both computers and networks continue to pack higher and higher levels of performance into smaller and smaller packages. Creative packaging and cooling systems are therefore being designed to keep pace with the thermal requirements of such aggressively designed systems.

FIGURES

A better understanding of the present invention can be obtained from the following detailed description in conjunction with the following drawings, in which:

FIGS. 5a through 5d depicts aspects of a mechanical loading device for an improved semiconductor chip packaging structure for an immersion cooling system;

FIG. 6 show experimental results for an improved semiconductor chip packaging structure for an immersion cooling system;

FIGS. 7a, 7b, 7c, 7d and 7e depicts aspects of another mechanical loading device for an improved semiconductor chip packaging structure for an immersion cooling system;

FIGS. 9a and 9b depict a boiling enhancement structure formed on a semiconductor chip die;

DETAILED DESCRIPTION

Figure 1:
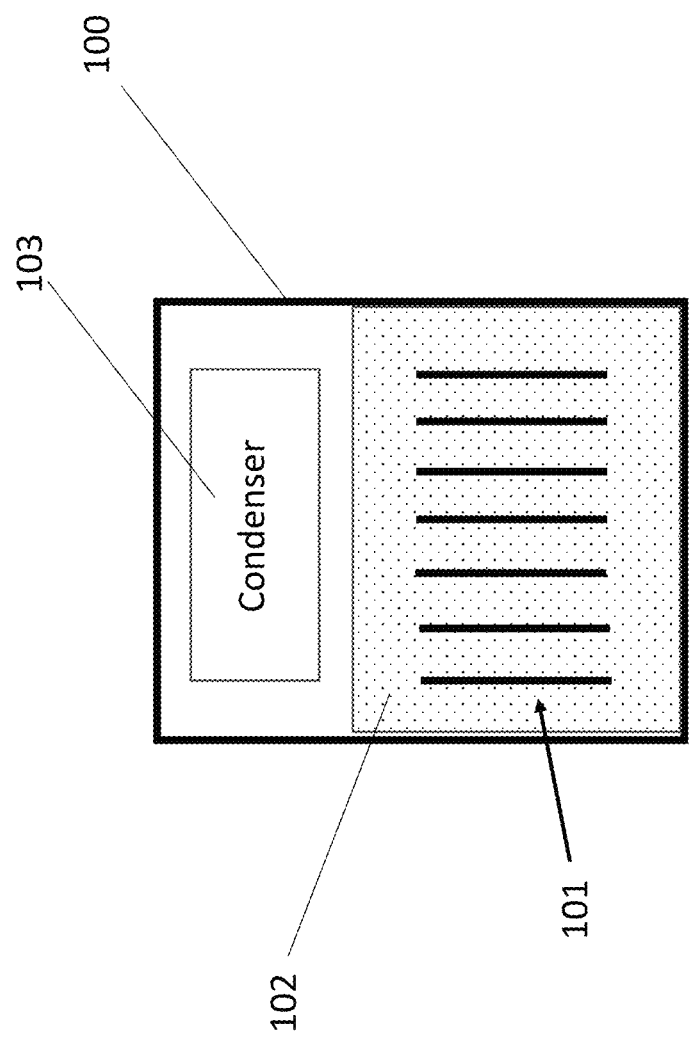
FIG. 1 shows an immersion cooling system (prior art)

FIG. 1 depicts an electronic system such as a data center chassis/board with many attached active components being cooled in an immersion cooling system 100. As observed in FIG. 1, one or more electronic circuit boards 101 with mounted electrical components (e.g., semiconductor chips) are powered on and operating while the boards 101 and their components are immersed in a bath of thermally conducting but electrically insulating liquid 102. The complete immersion of the boards 101 and their components maximizes the surface area of the electrical system over which heat from the operating semiconductor chips can be released into the cooling medium (coolant 102). Additionally, as compared to air cooled systems, a liquid generally has a much higher latent heat and specific heat than air, resulting in a much lower thermal resistance for electronics cooling.

Here, heat from the operating semiconductor chips is transferred from the electronic system to the immersion bath 102. According to a first step of such transfer, the temperature of the bath coolant 102 warms in response to the heat from the electronic system but does not boil (the temperature of the bath coolant 102 remains below the liquid's boiling point). According to a second step of such transfer, which, e.g., can be applicable if the electronic system is continuously operating above a certain power, the liquid in the thermal bath 102 boils and converts from a liquid to a vapor (the surface temperate of the electronic components on the board exceeds the liquid's boiling point). The boiling activity corresponds to a phase transition in the liquid (from liquid to gas) and, as such, the cooling technique is also referred to as phase transition cooling and the like. The vapor from the bath will be condensed through a condenser 103 and returned to the bath 102 in liquid phase which effectively removes heat from the packaged electronic devices and the overall electrical system.

Figure 2:
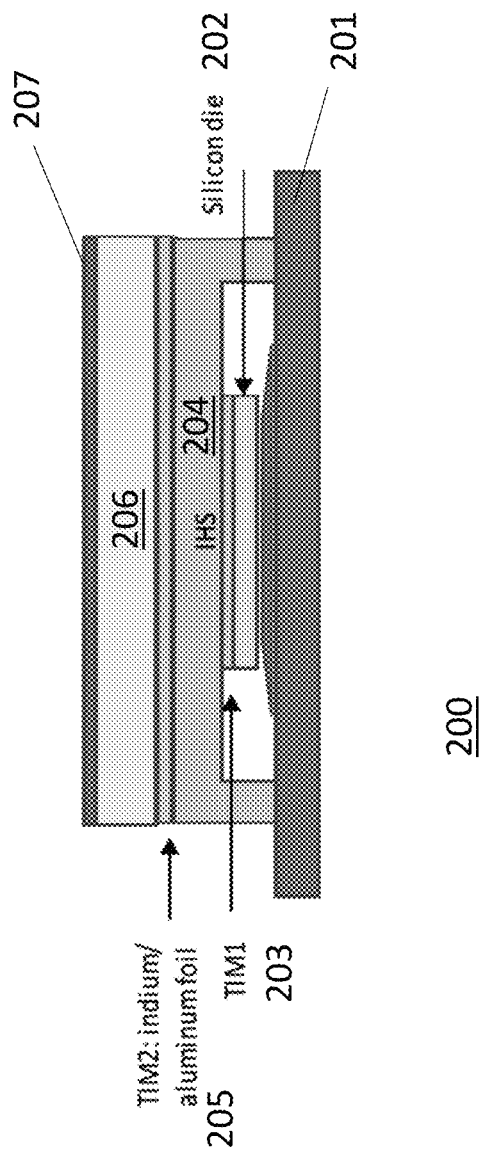
FIG. 2 shows a prior art semiconductor chip packaging structure for an immersion cooling system (prior art)

FIG. 2 shows a prior art structure for transferring heat from a packaged semiconductor chip 202 to an immersion bath. Here, micro-electrical connections of the semiconductor chip 202 are mounted to a package substrate which, in turn, is mounted to an electronic circuit board 201. The back side of the silicon chip 202 is attached to a first thermal interface material (TIM) 203 and placed in contact with the underside of the IHS 204 of the chip's package (also referred to as an integrated heat spreader (IHS)). The topside of the IHS is then attached to a second TIM 205. A thermally conductive solid part 206 (e.g., a solid block of copper) is placed on the second TIM 205. The top surface of the thermally conductive solid part 206 has a roughened micro-structure 207 that is formed, e.g., through surface treatment of the part 206 or through the application of a thermally conductive thin film 207 having a roughened micro-structural surface topography.

The aforementioned multi-layer structure is designed to transfer heat from the semiconductor chip to the roughened surface 207 with as little thermal resistance as is practicable (i.e., a high thermal efficiency is meant to exist between the semiconductor chip 202 and the roughened surface 207). The roughened surface 207 helps nucleate bubbles on the solid part surface in the bath so that the liquid cooling system moves the heat from the device through the liquid boiling process when the power of the device is above a certain level as described just above (in general, irregular (non-planar) surface structures (structured surfaces) help nucleate bubbles).

A problem with the prior art multi-layer structure 200 of FIG. 2 is its efficiency of heat transfer with multiple layers on top of the device. As observed in FIG. 2, the structure necessarily includes an additional thermal interface layer 205 and component 206 in the heat transfer path, and some additional expense/effort to roughen 207 the surface of the component 206.

Figure 3A:
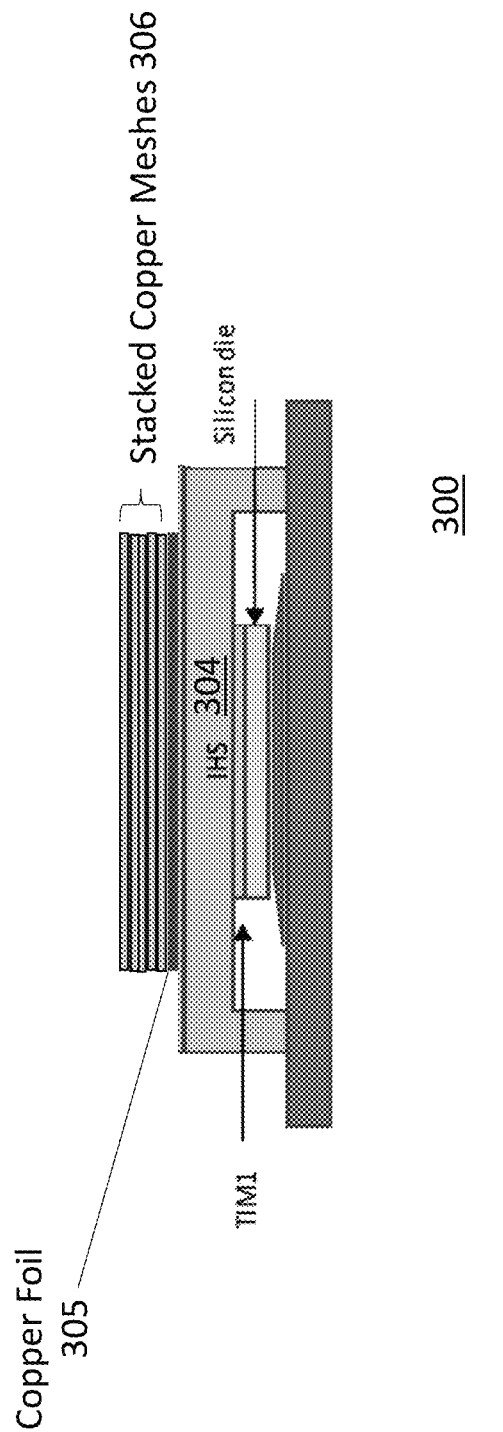
FIG. 3a shows an improved semiconductor chip packaging structure for an immersion cooling system.
Figure 4:
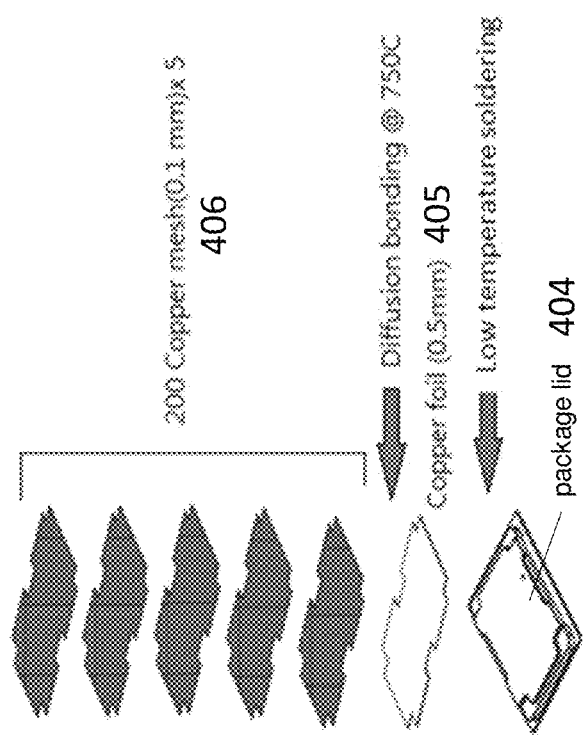
FIG. 4 shows a method of manufacturing an improved semiconductor chip packaging structure for an immersion cooling system.

FIGS. 3a and 4 depict a significantly less complex structure 300 that achieves even better thermal resistance/higher cooling capability between the semiconductor chip and the coolant in the bath than the prior art structure 200 of FIG. 2 by directly attaching thin copper/metal meshing 306 or other enhancement layer (e.g., a roughened surface or cut surface with small groove features, etc.) mounted directly to the IHS 304 of the semiconductor chip package (the large block mass 206 of FIG. 2 is not present). As will be more apparent below, the mesh structure 306 comprises non-planar or otherwise "structured" surfaces to promote bubble nucleation. FIG. 3a shows the finished structure with copper meshing directly 306 on the integrated heat spreader surface 304 while FIG. 4 depicts a method of making the structure.

Here, with the integrated heat spreader 304, 404 being composed of, e.g., a metal, an attachment layer such as a thin metal foil layer 305, 405 is attached to the integrated heat spreader 304, 404 with a low temperature (e.g., 150° C. or below) solder. With both the integrated heat spreader 304, 404 and metal foil attachment layer 305, 405 being thermally conductive, there exists low thermal resistance between the semiconductor chip and the metal foil 305, 405.

In the particular embodiment of FIGS. 3a and 4 five copper meshes are stacked to form the stacked mesh structure 306, 406 which is attached to the foil 305, 405. Other embodiments may choose a different number of meshes to effect the stacked structure. A mesh is essentially a woven thin "cloth" of narrow wires where, e.g., one set of the wires run orthogonal to another set of the wires.

Both the diameter of the wires and the spacings between the wires can vary from embodiment to embodiment (e.g., wire diameter can range in various embodiments from 50-200 μm and/or spacings between wires can range from 10-200 μm) such that, e.g., a range of window size openings through the mesh structure exists as possible embodiments. In various embodiments, the foil or other attachment layer 305/405 does not exist and the wire meshes are stacked directly on the integrated heat spreader 304/404 (e.g., by being soldered directly to the integrated heat spreader using a low temperature solder (e.g., Bi52Sn48 solder having a melting temperature of 138 C°)). In the depicted embodiment Copper is selected for both the mesh layers 306/406 and foil 305/405, but embodiments contemplated by the instant teachings are not limited to copper only.

The direct attachment of the bubble nucleation structure to the IHS of a packaged electronic device results in a less complex and/or expensive structure than the prior art approach of FIG. 2 that also demonstrates better thermal resistance/higher cooling capability between the semiconductor chip and coolant than the prior art approach of FIG. 2. According to one experiment a thermal resistance, measured as the difference between the temperature of the integrated heat spreader 304, 404 and the saturation temperature of the coolant normalized by the power consumed by the semiconductor chip (($\Delta$T)/W), as low as 0.042 C°/W was achieved with copper foil and five, stacked 200 gauge copper meshes (vs. 0.07'C°/W with a comparable structure that conforms to the approach of FIG. 1).

Figure 3B:
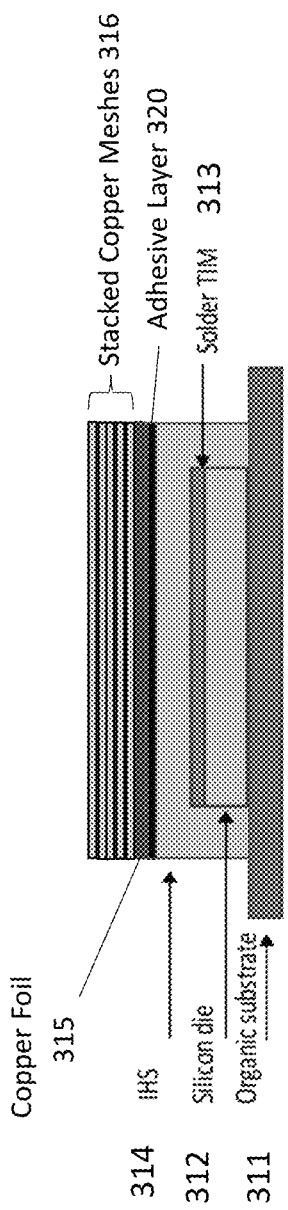
FIG. 3b shows another improved semiconductor chip packaging structure for an immersion cooling system.

FIG. 3b shows a more detailed view of an embodiment in which soldering is avoided during attachment of the mesh structure 316 to the IHS 314. Here, even in the case of a low temperature solder (e.g., Bi52Sn48 having a melting point of 138° C.), the peak temperature during soldering can reach temperatures as high as 160° C. (irrespective of whether the soldering is of the foil with mesh to the IHS or the mesh directly to the IHS). Such peak temperatures can detrimentally affect the integrity of the first TIM 313 that exists between the chip backside and the underside of the IHS 314 (e.g., the first TIM 313 is reflowed and then cures with higher thermal resistance) or induce failure mechanisms in the packaged electronic device(s).

Specifically, in the approach of FIG. 3b, the mesh 316 is first attached to the foil 315. The mesh 316 can be bonded through soldering or diffusion bonding to the foil 315 before the foil 315 is attached (or in contact with) the surface of the IHS 314. After the mesh 316 is attached to the foil 315, the foil 315 is attached to the IHS 314 using a high thermal conductivity adhesive layer 320 and a low temperature curing process. The low temperature curing process hardens the adhesive layer 320 and bonds the mesh 316/foil 315 to the IHS 314. The use of low temperature adhesive and curing to attach the adhesive to the mesh 316/foil 315 and IHS 314, rather than soldering, provides for mesh/foil attachment to the IHS without the application of temperatures high enough to affect the quality and/or intactness of the TIM 313 between the underside of the IHS 314 and the chip 312, which is supported by an organic substrate 311.

In various embodiments, the adhesive 320 is cured within a temperature range of 100-120° C. (or other range depending on the specific TIM 313). For example, the adhesive layer 320 is placed on the IHS 314 and then the mesh/foil structure is placed on the adhesive layer. The entire structure is then placed in an oven at 100-120° C. (under an appropriate mechanical loading/pressure) to cure the adhesive layer 320. In a particular embodiment, the adhesive layer is a 50 μm Henkel CF3350 adhesive film having a thermal conductivity of 7 W/m/K. Here, the high thermal conductivity preserves the low thermal resistance between the chip and mesh structure as described at length above.

The precise thermal resistance between the IHS/lid of a packaged electronic device and surrounding coolant is generally dependent on the device and its power density. With increasing silicon die size and reduced power density of the silicon die inside the package, thermal resistances as low as 0.01'C°/W have been achieved. Even lower thermal resistances are possible if die size increases and/or power density of the die decreases.

Other improvements, such as materials with better thermal properties than copper (e.g., diamond, sintered silver, nano-structure improved copper, direct copper to copper bonding w/o using soldering, etc.), and/or, structures having better bubble nucleation efficiency than a simple mesh or stack thereof (such as a specially milled metal plate having an enhancement structure that is optimized for bubble nucleation), could be applied to achieve even lower thermal resistances.

The boiling enhancement structure on mounted on the integrated heat spreader as described above can be used for both ball-grid-array (BGA) packages and land-grid-array (LGA) packages of semiconductor devices. In order to work with land grid array packages on printed circuit boards (PCBs) where the package has a boiling enhancement structure on its IHS surface as described above, a corresponding loading mechanism can be used to secure the package's electrical connections to the electronic circuit board that the chip is to be electro-mechanically coupled to.

Here, with the surface area of the integrated heat spreader being used to support the stacked mesh structure, and with the mesh structure to be immersed in the liquid bath, a loading mechanism that reliability keeps the packaged chip pressed into the electronic circuit board yet does not interfere with the mesh structure's immersion in the liquid is helpful.

Figure 5B:
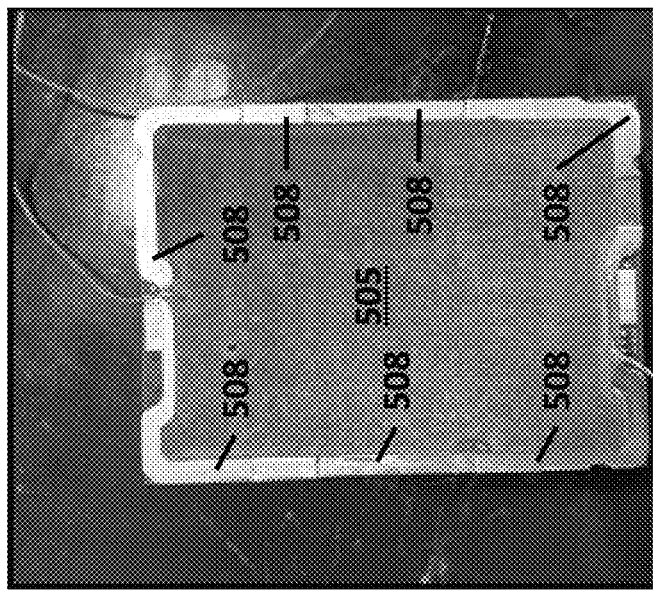
Figure 5A:
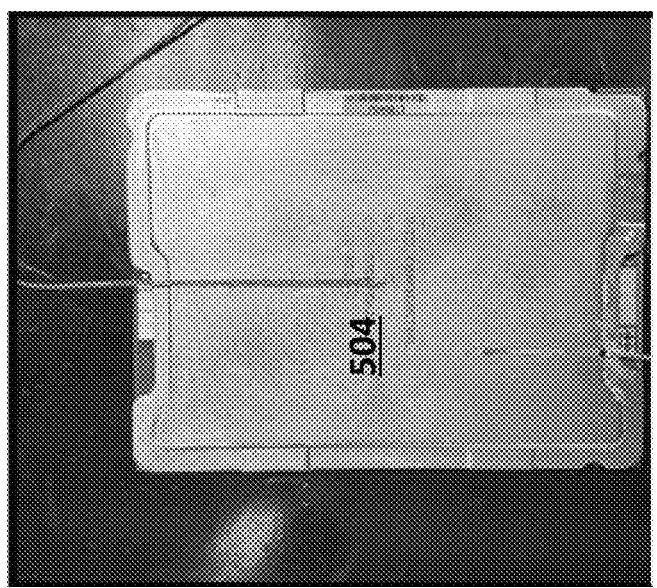

FIGS. 5a through 5d depict an embodiment for a loading mechanism that meets these requirements. FIG. 5a shows a depiction of the integrated heat spreader 504 without the copper foil while FIG. 5b shows a depiction of the integrated heat spreader after the copper foil 505 has been applied. In an embodiment, when the meshes are stacked on the foil 505, the respective surface that they cover do not advance beyond the surface area of the foil 505. As such, after the meshes have been stacked, there remains a periphery 508 of the integrated heat spreader around the foil/mesh that is still exposed.

This periphery is used to anchor the loading mechanism. That is, referring to FIG. 5c, according to one approach, the loading mechanism 510 has the general structure of a window frame, where, the frame presses against the exposed periphery 508 of the integrated heat spreader and the opening in the frame window exposes the stacked mesh structure to the liquid when the entire assembly is immersed in the bath.

Here, the frame's legs, in at least a few locations, are wide enough to interface with the IHS periphery 508 and provide for a plurality of holes 511 through which screws/bolts are to be inserted. The screws/bolts, referring to FIG. 5d, when inserted through the holes, thread into the circuit board 512 and/or backplate of the circuit board 512 thereby securing the loading mechanism 510 and chip package beneath it to the circuit board.

In other embodiments, some region of the integrated heat spreader other than the periphery could be used (e.g., lands that are more centrally located on the integrated heat spreader surface area).

In order to prevent warping of the loading mechanism 510 (and possible damage to the package and/or chip) while the screws/bolts are being torqued to anchor the loading mechanism 510 and chip package to the circuit board 512, the window opening in the frame includes at least one bar 513 (or other cross-structure that exists in the window opening) between different legs of the frame to more evenly distribute any uneven loading dynamics across the frame as a whole. Here, even distribution of loading forces across the frame (or near/approximate even distribution) essentially prevents warpage of the frame.

Additionally, the loading mechanism structure can be further improved through additional structural features. One example is bars 513 that are included in the loading mechanism design that do not touch the wire mesh structures. That is, according to various embodiments, there exists a gap between the bottom surface of each bar and the topmost copper mesh when the loading mechanism and chip package are fully secured to the circuit board. So doing, again, allows the fluid from the immersion bath to fully immerse the stacked mesh structure thereby allowing more efficient bubble nucleation as described above.

FIG. 6 shows test results that compare the prior art structure of FIG. 2 ("case 1") against the improved design of FIG. 3a ("case 2"). In the particular experiment, a stacked wire mesh was used as the boiling enhancement structure 207 for the case 1 structure. The stacked wire mesh for the case 1 structure was identical in design to the stacked wire mesh that was used for the case 2 structure so that any difference in thermal resistance owing to difference in boiling enhancement structures could eliminated. That is, the observed difference in thermal resistance as between the two structures is primarily a consequence of applying the boiling enhancement structure directly to the integrated heat spreader and/or elimination of the large block mass 206 and second TIM 205. As can be seen, the improved approach (case 2) has almost half the thermal resistance of the prior art approach (0.042 C°/W vs. 0.070 C°/W).

FIGS. 7a, 7b, 7c and 7d depict another embodiment in which the bars that span the window in the frame of the loading mechanism 710 include posts 715 on their underside to more evenly distribute the force of the loading mechanism on the IHS 704. Specifically, as observed in FIG. 7a, posts 715 on the underside of the bars press into the top surface of the IHS 704 when the loading mechanism 710 is being clamped down to the printed circuit board. As observed in FIG. 7b, holes 711 are formed in the mesh or other surface bubble nucleation structure 705 that is placed directly on the IHS 704. The holes 711 are aligned with the posts 715 so that the posts 715 fit through the holes 711. As observed in FIG. 7c, the posts 715 are evenly spaced about the surface of the IHS 704 so that the loading force is evenly spread across the surface of the IHS 704. Here, for example, the posts may take some loading force off of the periphery (as per the approach of FIGS. 5a,b,c,d) of the integrated heat spreader and instead apply it to regions of the integrated heat spreader within the window.

Figure 7D:
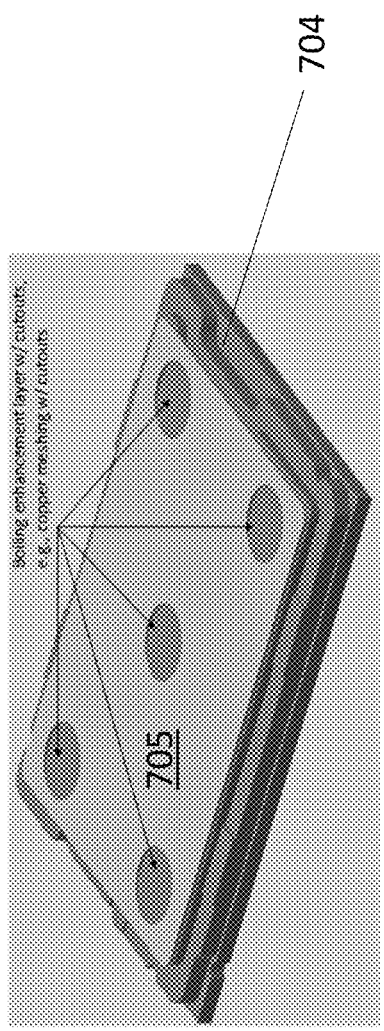
Figure 7E:
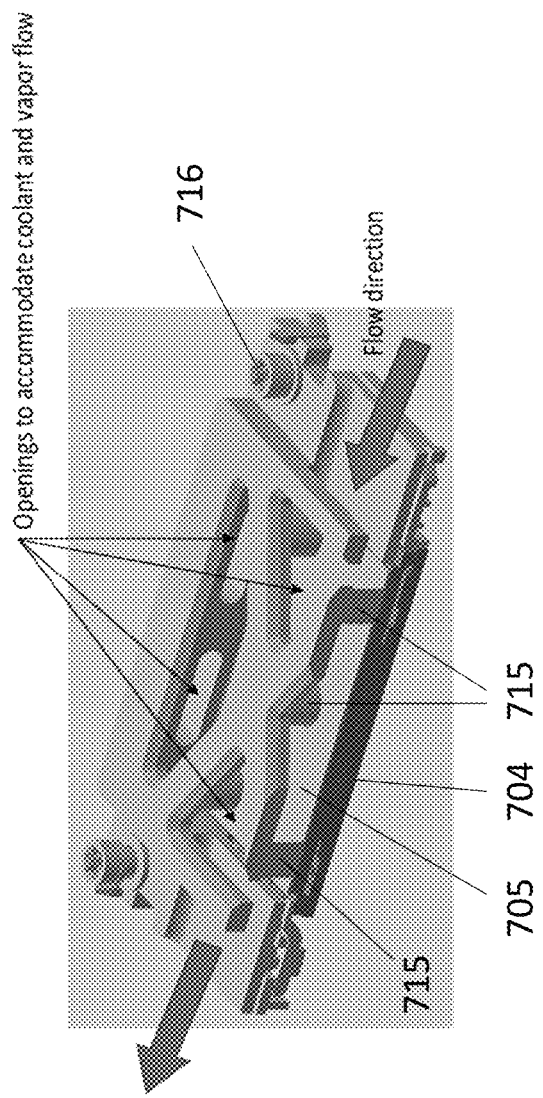

In an embodiment, as observed back in FIG. 7a, the surface of the posts are roughened or otherwise have structure to induce bubble nucleation. At the same time, it increases overall surface contact for boiling enhancement in two-phase immersion cooling Here, with the posts 715 directly touching the surface of the IHS 704, the posts 715 are apt to receive heat from the IHS 704. As such, the surface of the posts 715 can be roughened to promote bubble nucleation around the posts themselves. FIG. 7d shows an angled view of the mesh or other bubble nucleation structure 705 placed on the IHS 704. The holes for the posts are observed in the nucleation structure 705. FIG. 7e shows another angled view of the complete assembly, where, half of the complete assembly has been cut away. Here, loading nuts 716 can be low profile loading nuts in line with the an overall low-profile loading mechanism design for the embodiment shown in FIG. 7a through 7e. Here, the overall solution with the loading mechanism has a lower profile than a solution that includes a heat sink for standard air cooling or a cold plate used for traditional liquid cooling (both of which are a form of block mass). As such, the height of the completed assembly remains extremely low profile to enable high-density immersion cooling in data centers of other environments. For example, in one embodiment, the distance from the top of the frame to the IHS surface is less than 10 mm (e.g., 9.5 mm).

Thus, a package solution that progresses immediately from integrated heat spreader to boiling enhancement surface (a large block mass does not exist between the IHS and the bubble nucleation structure), like copper or other metal meshing, is believed to be a superior approach. Recalling that the integrated heat spreader can be composed of metal, approaches that could yield best results are those that specially form a boiling enhancement layer directly into the surface of the integrated heat spreader. That is, for example, a metal integrated heat spreader can be processed to possess a boiling enhancement surface topography (mesh-like, or otherwise, such as grooved, scratched, peaks and valleys, etc.) to promote bubble nucleation directly at the integrated heat spreader to bath interface (no copper foil or separate attached mesh exists).

Such processes could include any of the following to roughen the IHS surface: 1) machining the IHS surface (e.g., scoring, scratching, abrasive mechanical polishing, etc.); 2) inducing electrical discharge ("arcing") to/from the IHS surface; 3) electrochemical polishing; 4) coating the IHS surface with particulates such as microporous sintered metallic powder; 5) performing patterned etches into the IHS surface to (e.g., using photolithographic techniques to pattern/etch structures into the IHS surface such as "pin fins", micro-pillars, etc.). In various embodiments surface roughness within a range of 2 to 10 μm root-mean-square (rms) should be sufficient for bubble nucleation.

Surface roughness can be applied substantially evenly over the surface of the IHS, or, be patterned according to hot spots. For example, in the case of a large system-on-chip (SoC), certain areas of the chip (hot spots) may dissipate more heat than other areas of the chip. As such, the IHS surface roughness can be patterned to include higher surface roughness rms in areas of the IHS that are aligned with the hot spots than other areas of the IHS that are not aligned with the hot spots. In the case of multi-chip packages, the IHS surface roughness can be patterned to include higher surface roughness rms in areas of the IHS that are aligned with the location of a chip than other areas of the IHS that are not aligned with the location of a chip (the location of a chip corresponds to a hot spot).

Figure 8A:
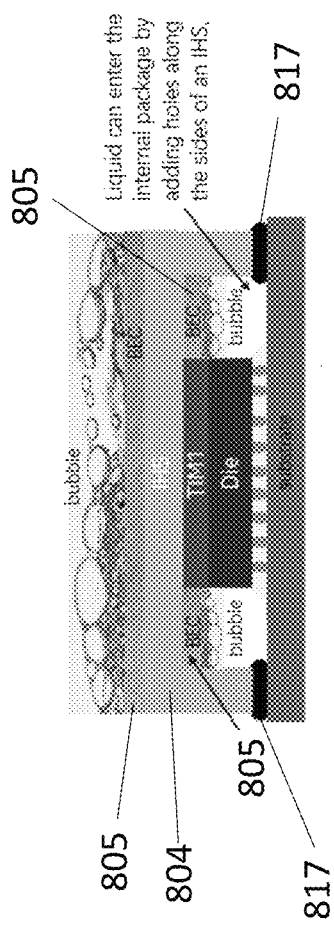
FIGS. 8a and 8b depict a boiling enhancement structure within a semiconductor chip package.
Figure 8B:
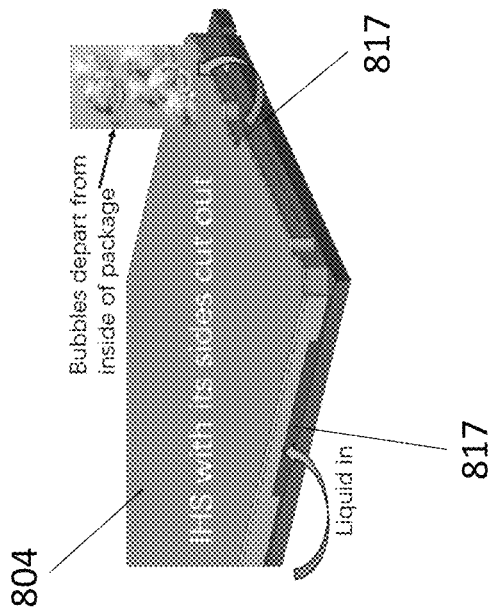

FIGS. 8a and 8b depict further approaches where the boiling enhancement structure is formed directly on the IHS and the liquid reaches closer to the semiconductor chip. FIGS. 8a and 8b depict a first embodiment in which the package itself is not hermetically sealed such that the liquid can penetrate inside the package. The bottom side of the IHS 804 (inside the package) also includes a boiling enhancement structure 805. Here, the immersion cooling liquid enters the package at openings 817 and comes in contact with the bottom side of the IHS 804. Heat that is generated from the die, passes to the IHS 804 via the thermal interface material (TIM). The heat received by the IHS 804 is then passed to the boiling enhancement structures 805 that exists both on the topside and bottom side of the IHS 804. The bubbles that are nucleated inside the package can escape through the same openings 817 that the immersion fluid enters the package, and/or, special openings may be formed (e.g., holes in the IHS) to allow bubbles to escape from the inside of the package. Because the package is not hermetically sealed, the die can be encapsulated (e.g., with polyimide) to protect exposed regions of the die.

FIG. 9a shows another approach where the die is not packaged such that the immersion fluid flows directly over the die. Additionally, the exposed surface of the die (which is commonly the "back-side" of the wafer substrate that the die was manufactured upon and cut from) is processed to roughen the die surface and thereby create a bubble nucleation structure 918. That is, a bubble nucleation structure 918 is patterned into the die substrate or die back side (e.g., by applying various etching and/or depositing processes directly to the die).

FIG. 9a shows an example where such die are mounted to dual-in line memory modules (DIMMs). Here, such die can be mounted to other kinds of circuit boards such as motherboards, other kinds of modules that plug into a motherboard, etc. The die can also be stacked such as in stacked memory solutions.

The elimination of the die package allows for extremely narrow form factors between die and/or between printed circuit boards. For example, the multiple DIMMs observed in FIG. 9a can be placed very closely to one another. Such integration yields improved function per unit of space, but could present challenges to the immersion cooling system. Specifically, the closer the modules are placed to one another the narrower the channels between modules through which the immersion coolant needs to flow. FIG. 9b therefore shows micro-piping 919 with nozzles 920. The piping 919 and nozzles 920 are designed so that the nozzles inject, e.g., higher velocity immersion coolant through the narrow openings between modules. Here, a micro-pump can be coupled to the micro-piping so that the nozzles 920 "squirt" high velocity jets of immersion cooling in between the modules.

To review any/all of the teachings above, a boiling enhancement structure effects increased active bubble nucleation (phase transition) site density through pores or other non-planar structures (such as those formed with a mesh structure) that are separately formed and then placed directly on the IHS surface, an/or, formed directly into the IHS surface (roughened IHS surface, an IHS surface patterned micro-pillars, etc.). Such boiling enhancement structures are able to cool the semiconductor chip(s) without the presence of a block mass between the boiling enhancement structure and the HIS.

Additionally, the teachings above lend themselves to lower profile solutions having smaller reduced vertical heights for the packaged chip(s) and the cooling hardware as compared to traditional approaches that use a large block mass to implement, e.g., the heat sink for an air cooled approach or the cold plate for a liquid cooled approach. For embodiments where the boiling enhancement structure is composed of wire meshing, the top of the boiling enhancement structure is as little as 0.5 mm or less above the surface of the IHS. Better still, for embodiments where the boiling enhancement structure is an IHS surface that has been, e.g., roughed, machined or patterned, the boiling enhancement structure does not add any height above the IHS for the overall solution. Any loading mechanism can likewise also be a low profile solution.

For embodiments where the chip is packaged, the packaged semiconductor chip can be any of a number of different, e.g., high performance, semiconductor chips, such as, to name a few possibilities, a multi-core CPU processor, a graphics processor, a system-on-chip, an accelerator chip (e.g., neural network processor), a general purpose graphics processing unit (GPGPU), a field programmable gate array (FPGA), an application specific integrated circuit (ASIC), etc. Embodiments can also include implementations where there is more than one semiconductor chip within a single package.

The different teachings above are capable of being combined with one another according to any of a number of different combination possibilities. For example, the different loading mechanism teachings of FIGS. 5a,b,c,d can be combined with the loading mechanism teachings of FIGS. 8a and 8b to form a single loading mechanism. Likewise, the different loading mechanisms and/or an embodiment that combines loading mechanism teachings can be combined with any of the boiling enhancement structure teachings. The packaging solution of FIGS. 8a and 8b can be combined with any of these, etc.

Figure 10:
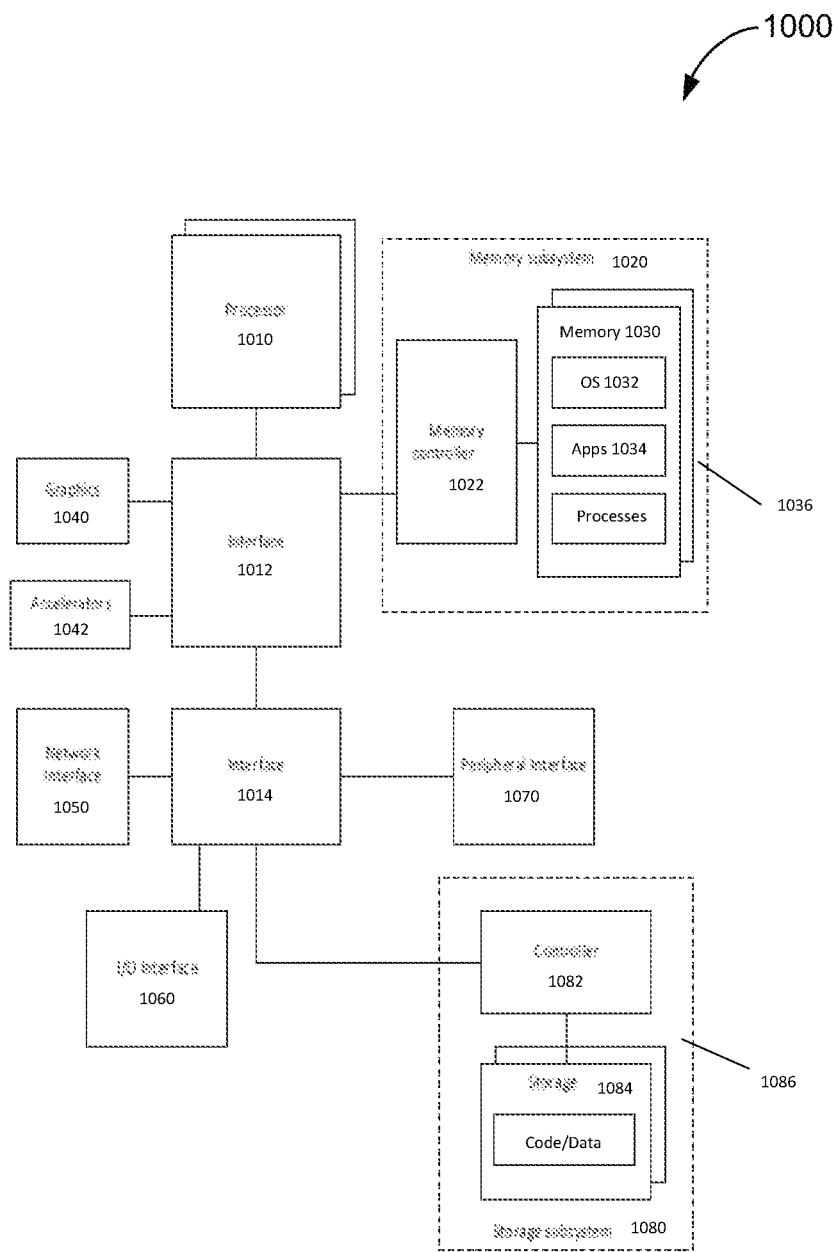
FIG. 10 shows a computing system.

FIG. 10 depicts an exemplary system that could be immersed into a liquid bath having semiconductor chips whose package lids (or the semiconductor chips themselves) have boiling enhancement layer surfaces as described above. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function offload engine that can be accessed or used by a processor 1010. For example, an accelerator among accelerators 1042 can provide compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), "X" processing units (XPUs), neural network processors (NNPs), programmable control logic, and programmable processing elements such as field programmable gate arrays (FPGAs). Accelerators 1042 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, volatile memory, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented using interconnected compute sleds of processors, memories, storages, network interfaces, and other components. High speed interconnects can be used such as PCIe, Ethernet, or optical interconnects (or a combination thereof).

Figure 11:
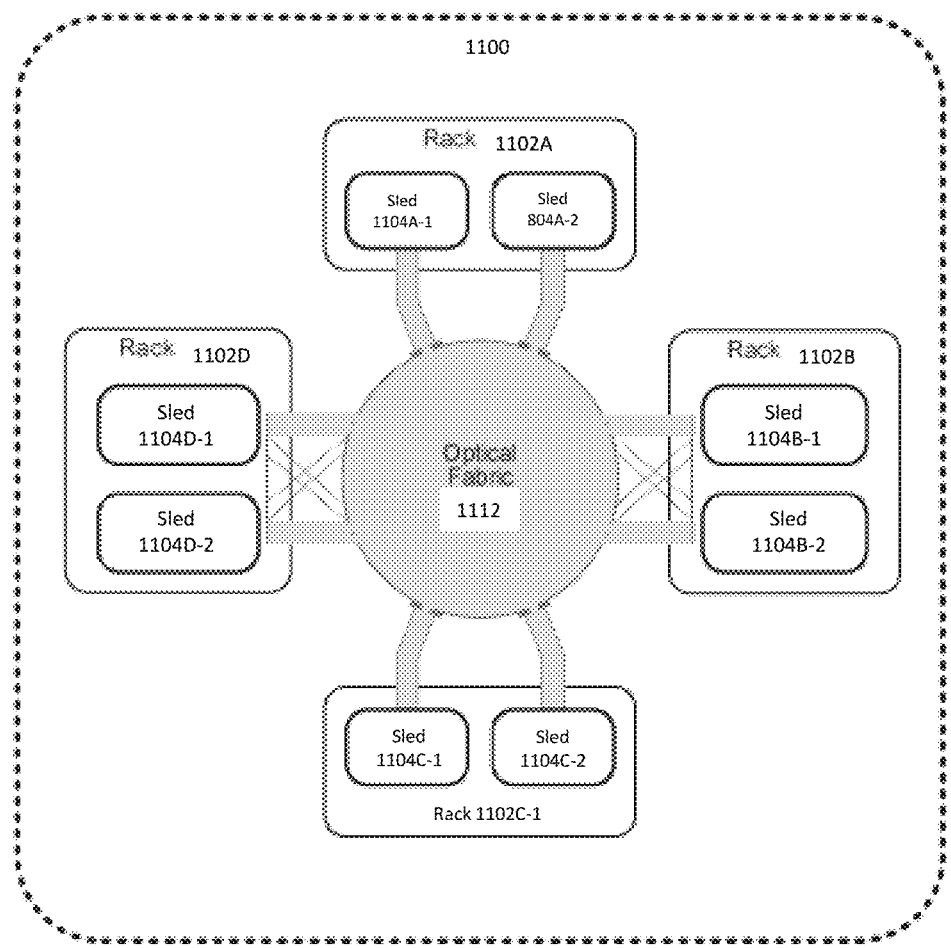
FIG. 11 shows a data center.

FIG. 11 depicts an example of a data center. Various components of the data center could employ liquid immersion cooling with the packaging lids of constituent semiconductor chips having boiling enhancement layers as described at length above. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. However, optical, wireless, and/or electrical signals can be transmitted using fabric 1112. The signaling connectivity that optical fabric 1112 provides to any given sled may include connectivity both to other sleds in a same rack and sleds in other racks. Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 1112 can provide sled signaling connectivity with one or more of the seven other sleds. For example, via optical fabric 11012, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

Figure 12:
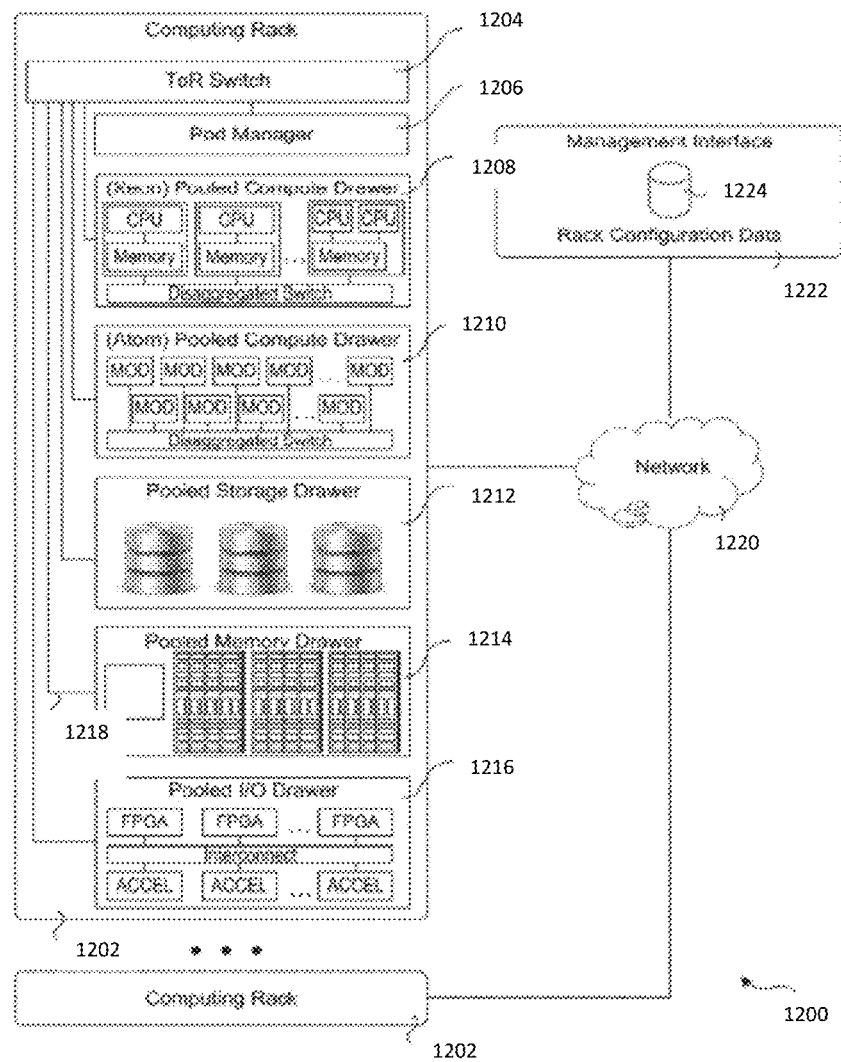
FIG. 12 shows a rack mounted system.

FIG. 12 depicts an environment 1200 includes multiple computing racks 1202, each including a Top of Rack (ToR) switch 1204, a pod manager 1206, and a plurality of pooled system drawers. Here, conceivably, any of these mechanical components could be designed to employ immersion bath cooling whose constituent semiconductor chips have package lids with boiling enhancement layers as described at length above. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an INTEL® XEON® pooled computer drawer 1208, and INTEL® ATOM™ pooled compute drawer 1210, a pooled storage drawer 1212, a pooled memory drawer 1214, and an pooled I/O drawer 1216. Each of the pooled system drawers is connected to ToR switch 1204 via a high-speed link 1218, such as a 40 Gigabit/second (Gb/s) or 100 Gb/s Ethernet link or an 100+Gb/s Silicon Photonics (SiPh) optical link. In one embodiment high-speed link 1218 comprises an 800 Gb/s SiPh optical link.

Multiple of the computing racks 1200 may be interconnected via their ToR switches 1204 (e.g., to a pod-level switch or data center switch), as illustrated by connections to a network 1220. In some embodiments, groups of computing racks 1202 are managed as separate pods via pod manager(s) 1206. In one embodiment, a single pod manager is used to manage all of the racks in the pod. Alternatively, distributed pod managers may be used for pod management operations.

RSD environment 1200 further includes a management interface 1222 that is used to manage various aspects of the RSD environment. This includes managing rack configuration, with corresponding parameters stored as rack configuration data 1224.

The data center and rack implementations of FIGS. 11 and 12 can be used to implement any of a traditional data center, a base station data center, a micro-data center (e.g., edge data center), etc.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. A system comprising:
a packaged semiconductor device;
an integrated heat spreader, thermally coupled to the packaged semiconductor device;
a first boiling enhancement layer located on a first side of the integrated heat spreader; and
a second boiling enhancement layer located on a second side of the integrated heat spreader, the second side opposite the first side, each of the first boiling enhancement layer and the second boiling enhancement layer having a non-planar surface.

2. The system of claim 1, wherein the first boiling enhancement layer includes wire meshes that are coupled to the first side of the integrated heat spreader.

3. The system of claim 2, wherein a metal foil is located between the wire meshes and the first side of the integrated heat spreader.

4. The system of claim 1, wherein the integrated heat spreader is in an immersion cooling system and a thermal resistivity between the integrated heat spreader and a saturation temperature of a liquid of the immersion cooling system is no greater than 0.042 C°/W.

5. The system of claim 1, wherein the non-planar surface of the first boiling enhancement structure comprises layer includes at least one of a roughened surface or a patterned surface.

6. The system of claim 1, further including an adhesive layer between the first boiling enhancement layer and the integrated heat spreader.

7. The system of claim 1, wherein a package of the packaged semiconductor device has openings to permit liquid coolant inside the package.

8. An apparatus, comprising:
a loading layer to mount a packaged semiconductor chip to a circuit board; and
a boiling enhancement layer coupled to exist on an integrated heat spreader of the packaged semiconductor chip, the boiling enhancement layer having a non-planar surface, the loading layer including a frame having at least one opening to provide direct contact between a liquid of a liquid bath and the boiling enhancement layer when the packaged semiconductor chip is in the liquid bath.

9. The apparatus of claim 8, wherein at least one bar is located within the at least one opening.

10. The apparatus of claim 8, wherein the loading layer is to contact a peripheral region of the integrated heat spreader or another region of the integrated heat spreader.

11. The apparatus of claim 10, wherein the loading layer is to contact the peripheral region of the integrated heat spreader and the boiling enhancement layer is within the peripheral region.

12. The apparatus of claim 9, wherein the boiling enhancement layer includes wire meshes stacked on the integrated heat spreader.

13. The apparatus of claim 12, wherein a metal foil is located to reside between the wire meshes and the integrated heat spreader.

14. The apparatus of claim 8, wherein the boiling enhancement layer includes a roughened surface or a patterned surface.

15. The apparatus of claim 8, wherein when the packaged semiconductor chip is in the liquid bath, a thermal resistivity between the integrated heat spreader and a saturation temperature of the liquid is no greater than 0.042 C°/W.

16. The apparatus of claim 8, wherein at least one post extends from beneath a bar that is located in the at least one opening, wherein, the post is to apply force to the integrated heat spreader to apply some loading force of the loading layer to a region of the integrated heat spreader within the at least one opening.

17. The apparatus of claim 16, wherein a hole exists in the boiling enhancement layer through which the post extends through.

18. A system, comprising:
a liquid bath;
an electronic circuit board to be immersed in the liquid bath;
a packaged semiconductor device, the packaged semiconductor device including an integrated heat spreader;
a boiling enhancement layer coupled to the integrated heat spreader, the boiling enhancement layer having a non-planar surface; and
a loading layer that secures the packaged semiconductor device to the electronic circuit board, the loading layer having at least one opening to provide direct contact between the liquid bath and the boiling enhancement layer when the electronic circuit board including the packaged semiconductor device is immersed in the liquid bath.

19. The system of claim 18, wherein the loading layer contacts a peripheral region of the integrated heat spreader or another region of the integrated heat spreader.

20. The system of claim 19, wherein the boiling enhancement layer includes wire meshes stacked on the integrated heat spreader.

21. The system of claim 20, wherein a metal foil resides is located between the wire meshes and the integrated heat spreader.

22. The system of claim 18, wherein the boiling enhancement layer includes a roughened surface or a patterned surface.

23. The system of claim 18, wherein when the packaged semiconductor device is in the liquid bath, a thermal resistivity between the integrated heat spreader and a saturation temperature of the liquid of the liquid bath is no greater than 0.042 C°/W.

24. An apparatus, comprising:
an integrated heat spreader including a patterned surface, the integrated heat spreader thermally coupled to a semiconductor chip; and
a loading layer to mount the semiconductor chip to a circuit board, the loading layer including a frame having at least one opening to provide direct contact between a liquid of a liquid bath and the patterned surface of the integrated heat spreader when the semiconductor chip is immersed in the liquid bath.

* * * * *

UNITED STATES PATENT AND TRADEMARK OFFICE
CERTIFICATE OF CORRECTION

PATENT NO. : 12,293,956 B2
APPLICATION NO. : 17/356014
DATED : May 6, 2025
INVENTOR(S) : Yang et al.

Page 1 of 1

It is certified that error appears in the above-identified patent and that said Letters Patent is hereby corrected as shown below:

In the Claims

In Column 15, Claim 5, Line 54, delete "structure comprises".

Signed and Sealed this
Fifteenth Day of July, 2025

Coke Morgan Stewart
*Acting Director of the United States Patent and Trademark Office*